United States Patent [19]

Igel et al.

[11] Patent Number: 5,858,808
[45] Date of Patent: Jan. 12, 1999

[54] PROCESS AND AUXILIARY DEVICE FOR FABRICATING SEMICONDUCTOR DEVICES

[75] Inventors: Gunter Igel, Teningen; Johann Schroeder, Simonswald, both of Germany

[73] Assignee: Deutsche ITT Industries GmbH, Freiburg, Germany

[21] Appl. No.: 784,002

[22] Filed: Jan. 15, 1997

[30] Foreign Application Priority Data

Jan. 16, 1996 [DE] Germany ................... 196 01 261.9

[51] Int. Cl.⁶ ........................................ H01L 21/304
[52] U.S. Cl. .................. 438/42; 438/91; 438/141; 438/460; 438/462; 438/465; 438/759; 438/928; 438/942; 438/945; 438/380; 29/25.01
[58] Field of Search .................. 438/39, 42, 91, 438/141, 460, 462, 465, 759, 820, 928, 945, 942, 380, 415, 386; 148/DIG. 28 (U.S. only); 29/25.01; 327/504; 216/52 (U.S. only)

[56] References Cited

U.S. PATENT DOCUMENTS

| | | |
|---|---|---|
| 3,972,113 | 8/1976 | Nakata et al. . |
| 4,029,531 | 6/1977 | Marinelli .................. 156/64 |
| 4,217,689 | 8/1980 | Fuji et al. .................. 29/583 |
| 4,814,296 | 3/1989 | Jedlicka et al. .......... 437/226 |

FOREIGN PATENT DOCUMENTS

| | | | |
|---|---|---|---|
| 57-60843 | 4/1982 | Japan .................. | 438/386 |
| 60-85540 | 5/1985 | Japan . | |
| 61-61436 | 3/1986 | Japan . | |
| 61-253830 | 11/1986 | Japan . | |
| 3209743 | 9/1991 | Japan . | |

Primary Examiner—Charles Bowers
Attorney, Agent, or Firm—Plevy & Associates

[57] ABSTRACT

An auxiliary device is constituted by a U-bolt-shaped, pincer-like implement which, during the fabrication of semiconductor devices with a mesa structure from a starting substrate forming a wafer, serves to transfer the outline geometry of the individual semiconductor devices from one side of the wafer to the back of the wafer. The implement has at least one tracer at the end of one of its arms for engaging a sawed groove and for guiding the implement along the sawed groove on one side of the wafer. At the end of the other arm, a marking device with at least one marking stylus is provided whereby the course of the at least one sawed grooved can be transferred from the front side of the wafer to the back, and scribed there in the form of auxiliary lines.

12 Claims, 2 Drawing Sheets

PROCESS AND AUXILIARY DEVICE FOR FABRICATING SEMICONDUCTOR DEVICES

FIELD OF THE INVENTION

The present invention generally relates to semiconductor processing and more particularly, to a process and apparatus for fabricating individual semiconductor devices with mesa structures from a starting substrate.

BACKGROUND OF THE INVENTION

Individual semiconductor devices with mesa structures are typically fabricated from a starting substrate by doping the front and back sides of the substrate with impurities of opposite conductivity types using diffusion techniques and subsequently, providing each of the diffusion layers with a respective metal layer. In the prior art, such processing steps are followed by the application of a photoresist layer to each of the metal layers and the formation of an etch mask from the photoresist layers on each side of the substrate using photolithography. This is accomplished by employing a dual exposure system to expose the front and back sides of the wafer to develop the photoresist layers. After developing and patterning the photoresist layers, the exposed regions of the metal layers on both sides of the substrate are etched. Next, silicon etching is performed on both sides of the substrate to simultaneously form a mesa structure and uncover the pn junction. Finally, the photoresist layers on each side of the substrate is removed and the chips are separated.

The photolithographic process requires considerable expenditure for clean rooms, for chemicals, and particularly for the specific, costly dual exposure system. The removal of the photoresist layers causes waste-disposal and cost problems. The photoresist on the metallic contact areas can cause organic residual material to be present on the metal layers and also in the metal pores, so that during attachment of the chips by soldering, problems may arise due to poor solderability.

Accordingly, it is an object of the present invention to provide a process and an auxiliary device for fabricating individual semiconductor devices having a mesa structure, the process being substantially simpler and, in particular, permitting a considerable reduction of the hitherto required expenditure, this also applying to the auxiliary device.

SUMMARY OF THE INVENTION

A process for fabricating individual semiconductor devices with mesa structures from a starting substrate having a first side and a second side, the process comprising doping the first and second sides of the starting substrate with impurities of opposite conductivity types by diffusion to form first and second diffusion layers. Next, a metal layer is provided on each of the first and second diffusion layers to form the substrate into a wafer and then, sawed grooves are formed on a first side of the wafer which correspond to the outline geometry of individual semiconductor devices, wherein the formation of the sawed groove uncovers pn junctions in the wafer. Finally, auxiliary lines which are parallel to the sawed grooves, are mechanically transferred to a second side of the wafer by means of a pincer-like auxiliary device, the auxiliary device engaging the sawed grooves, which serve as guides for the device.

The auxiliary device comprises a U-bolt-shaped, pincer-like implement having a first arm and a second arm. A tracer at an end of the first arm is provided for engaging a sawed groove in a first side of a wafer and guiding the implement along the sawed groove. A marking device at an end of the second arm is provided for transferring the course of the sawed groove from the first side of the wafer to a second side of the wafer, as an auxiliary line extending parallel to the sawed groove.

BRIEF DESCRIPTION OF THE DRAWINGS

The invention will now be explained in more detail with reference to the accompanying drawings, in which.

DETAILED DESCRIPTION OF THE INVENTION

Figure 1A:
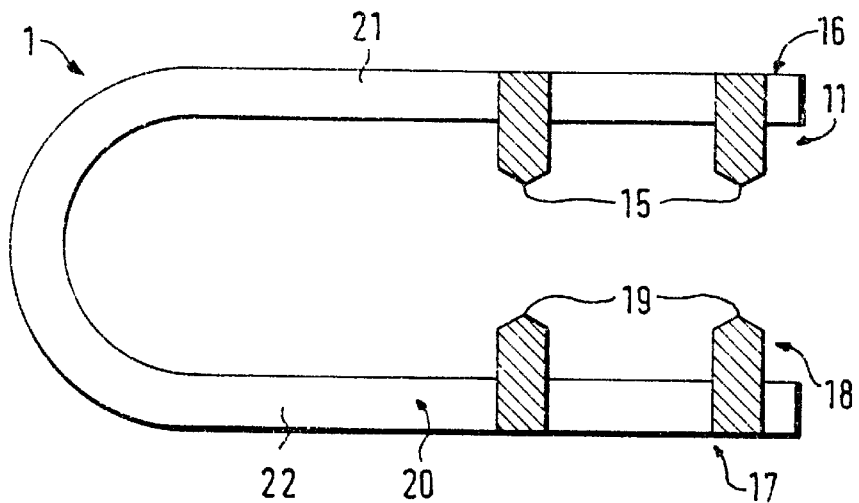
FIG. 1A is a schematic representation of an auxiliary device of the present invention.

Referring to FIG. 1A, an auxiliary device 1 made in accordance with the present invention is shown. The auxiliary device 1 comprises a U-bolt-shaped, pincer-like implement 20 having one or more tracers 15 at a first end 16 of a first arm 21, for engaging a sawed groove in a first side of a semiconductor wafer and guiding the implement 20 along the sawed groove on the first side of the wafer. One or more marking devices 18 consisting of marking styli 19 are disposed at a second end 17 of a second arm 22 of the implement 20 for transferring the course of the sawed groove from the first side of the wafer to the second side as an auxiliary line extending parallel to the sawed groove.

With the auxiliary device 1 of the present invention, system geometries can be transferred form one wafer side to the other with sufficient accuracy, as tests have shown. The expenditure for the auxiliary device of the present invention is only a fraction of the expenditure required, particularly for the dual exposure systems and the photolithography of the prior art.

In a preferred embodiment of the invention, two or more tracers 15 are provided at the first end 16 of the first arm 21 of the implement 20 and two or more marking styli 19 at the second end 17 of the second arm 22 of the implement 20. Thus, two or more auxiliary lines corresponding to the course of the sawed grooves on the first side of a wafer can be transferred simultaneously to the second side of the wafer.

In the process of the present invention, the auxiliary device 1 of FIG. 1A is applied to a wafer 2 having a first or front side 11 and a second or back side 13, of which only an edge portion is shown here. Such a wafer may, for example, have a diameter of 100 millimeters or more and a thickness of 300 $\mu$m. In the embodiment shown, a plurality of double diodes with double-sided mesa structure are formed from the wafer 2, an individual chip 3 being shown in FIG. 7. The outsides of the two mesa structures are covered by metal layers 4 and 5, which serve as contact pads for making electrical connections to diode lead wires. Toward the inside, the two outer metal layers 4, 5 are adjoined by a pnp layer structure or an npn layer structure.

Figure 2:
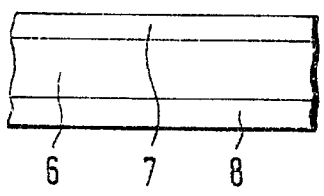
FIGS. 2 to 6 show a portion of the wafer in different processing stages in accordance with the present invention.
Figure 3:
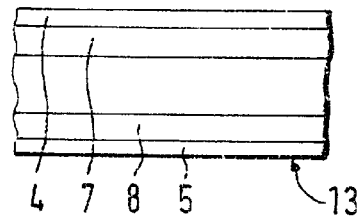
Figure 7:
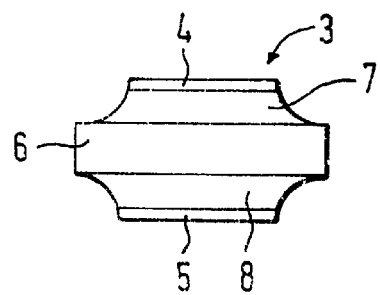
FIG. 7 shows a separated chip.

To fabricate the chip 3 of FIG. 7, impurities of conductivity types opposite to those of the wafer 2 are first diffused into a starting substrate 6, forming p-type layers 7 and 8, for example as shown in FIG. 2. Then, the metal layers 4 and 5 are deposited on the layers 7 and 8, respectively as shown in FIG. 3.

Figure 4:
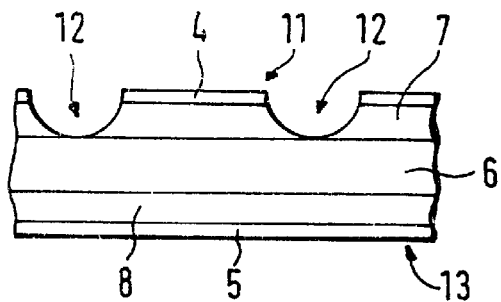

In the next process step as depicted in FIG. 4, sawed grooves 12 are formed on the first side 11 of the wafer 2 in accordance with the outline geometry of the individual semiconductor devices, the figures showing only parallel sawed grooves 12 which extend in one direction. At right angles to these sawed grooves 12, there are provided other sawed grooves (not visible) which are preferably spaced the same distance apart, so that square, mesa-shaped partial geometries are formed between the sawed grooves.

Figure 5:
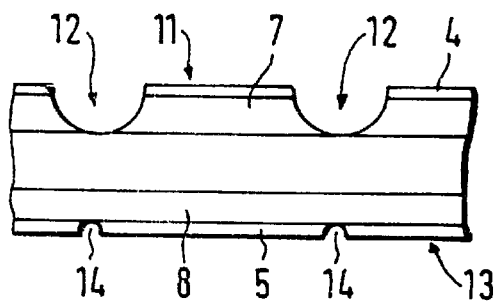

To fabricate the chip 3 of FIG. 7 for double diodes, it is necessary to form a mesa structure corresponding to that visible on the first side 11 of the wafer 2 in FIGS. 4 and 5, and also on the second side 13 of the wafer 2; in the embodiment being described, these mesa structures are to be located directly opposite to each other without lateral displacement.

Figure 1B:
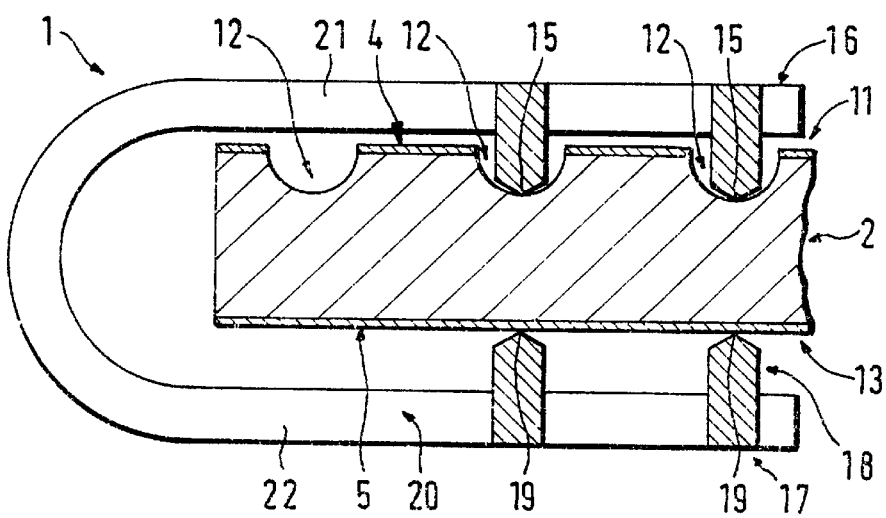
FIG. 1B is a schematic representation of the auxiliary device of FIG. 1A applied to a wafer.

To transfer auxiliary lines 14 corresponding to the course of the sawed grooves 12 on the front side 11 of the wafer to the back side 13 of the wafer 2, the auxiliary device 1 shown in FIGS. 1A and 1B is provided. As described earlier above, the device is constituted essentially by a U-bolt-shaped, pincer-like implement 20 having one or more tracers 15 at the end 16 of its first arm 21 for engaging the sawed grooves 12. At the end 17 of the second arm 22, one or more marking devices 18 are provided whereby auxiliary lines 14 can be formed in the back surface 13 of the wafer as shown in FIG. 5. The sawed grooves 12 on the front side 11 of the wafer 2 serve as longitudinal guides, so that auxiliary lines 14 parallel to these sawed grooves 12 can be formed on the back side 13 of the wafer 2.

As can be seen in the embodiment of FIGS. 1A and 1B, the tracers 15 and the marking styli 19 are located opposite each other in one plane which is perpendicular to the plane of the wafer 2. Thus, the sawed grooves 12 and the auxiliary lines 14 are not laterally displaced in relation to one another. If necessary, however, this can also be achieved by another arrangement of the tracers 15 or the marking styli 19.

By means of the auxiliary device 1 of the shown embodiment, chips 3 (only one chip shown in FIG. 7) can be fabricated which are constructed symmetrically with respect to front and back.

With the marking devices 18, auxiliary lines 14 are scribed, preferably in the metal layer 5, the scribe lines being only so deep that they can be optically detected and used to control a sawing device for forming the sawed grooves along the auxiliary lines 14 on the underside.

Figure 6:
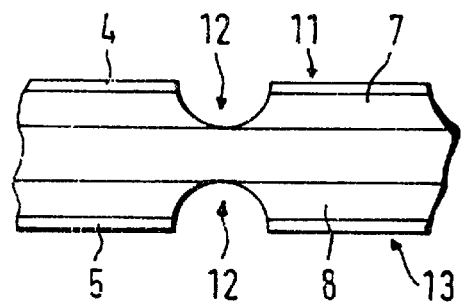

As can be seen in FIG. 6, sawed grooves 12 are then formed on the back side 13 of the wafer 2 symmetrically with respect to the sawed grooves 12 on the front side 11 of the wafer 2.

The wafer 2, provided with sawed grooves 12 on both sides, is then silicon-etched on both sides to remove the roughness caused by the sawed grooves in the area of the pn junctions, and a mechanically smooth layer is also formed in the area of the pn junctions.

Finally, the wafer 2 is separated into the individual chips along the sawed grooves 12 located opposite each other of which one chip 3 is shown in FIG. 7.

When transferring the sawed-groove positions form the front side 11 of the wafer 2 to the back side 13 it suffices to transfer two crossing auxiliary lines 14. Since the positions of the auxiliary lines 14 extending parallel to the two crossing auxiliary lines, or of the sawed grooves to be formed there, can be derived from the positions and the course of the two crossing auxiliary lines, positioning errors are minimized if the two crossing auxiliary lines extend approximately at the center of the wafer 2. Thus, the sawed grooves 12 on the front side 11 of the wafer 2, whose length is equal to the diameter of the wafer, are available for guiding the implement 20 in forming the auxiliary lines 14. In addition, with crossing auxiliary lines 14 extending centrically, only half of the total of sawed grooves 12 to be formed on the back side 13 are derived from such lines on each side, so that secondary positioning errors are kept small. With the implement 20 shown in FIGS. 1A and 1B, a diametric auxiliary line and an auxiliary line 14 spaced therefrom by, e.g., half the radius could also be transferred simultaneously. The positioning accuracy of the auxiliary lines 14 can thus be further improved. In that case, the length of the arms of the implement would have to be approximately equal to the wafer radius.

In the embodiment of the auxiliary device shown in FIGS. 1A and 1B, sufficient guidance is provided for the implement 20 by the use of two tracers 15 and two opposite marking styli 19.

Additionally, or if only one tracer 15 and one marking stylus 19 is present, a side of one arm of the implement which faces toward the wafer 2 may be designed as a guide surface resting on the wafer to avoid any tilting of the implement 20. It is also possible to connect the implement 20 to a drive for moving the implement longitudinally along a sawed groove. The implement may also be connected to a drive for a lateral prepositioning movement for placing the tracer into one of the parallel sawed grooves. This is only a prepositioning step, since longitudinal guidance is provided during the longitudinal movement of the implement 20 by the sawed groove(s) 12 in the upper surface 11 of the wafer.

The arms of the implement are advantageously resiliently interconnected, so that the implement can be bent open for application to and removal from the wafer. After the tracer(s) 15 has been positioned in a sawed groove 12, the marking stylus 19 acts on the back 13 of the wafer under slight spring preloading.

As mentioned above, the wafer 2 may have a diameter of, e.g., 100 millimeters. If the wafer has a greater diameter, e.g., 200 millimeters, it is advantageous to mechanically stabilize the wafer prior to the formation of the sawed grooves 2 on one side 11 of the wafer.

This can be done covering the back side 13 of the wafer 2 with an auxiliary layer which is formed, for example, by thickening the metal layer 5, which is provided for contacting purposes. It is also possible to form such a mechanically stabilizing auxiliary layer by applying lacquer, particularly polyimide. If lacquer is used for the stabilizing layer, the latter with be removed after completion of the mechanical processing the wafer.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A process for fabricating individual semiconductor devices with mesa structures from a starting substrate having given conductivity type and a first side and a second side, comprising the steps of:

doping the first and second sides of the starting substrate with impurities of opposite conductivity type then said substrate by diffusion to form first and second diffusion layers;

providing a metal layer on each of the first and second diffusion layers to form the substrate into a wafer;

forming sawed grooves on a first side of the wafer which correspond to the outline geometry of individual semiconductor devices, wherein the formation of the sawed groove uncovers pn junctions in the wafer; and mechanically transferring auxiliary lines, which are parallel to the sawed grooves, to a second side of the wafer by means of a pincer-like auxiliary device, the auxiliary device engaging the sawed grooves, which serve as guides for the device.

2. A process as claimed in claim 1, wherein the courses of at least two crossing sawed grooves, which are approximately centric sawed grooves of the first side of the wafer, are transferred to the second side of the wafer as the auxiliary lines, the auxiliary lines being parallel to the at least two crossing sawed grooves.

3. A process as claimed in claim 1, wherein the auxiliary lines are parallel to the sawed grooves of the first side of the wafer and are in a plane perpendicular to a plane defined by the wafer.

4. A process as claimed in claim 1, wherein the transferred auxiliary lines are formed by scribing the metal layer.

5. A process as claimed in claim 1, wherein the auxiliary lines are used as control lines for a sawing device, and that the sawed grooves adjacent and parallel to the auxiliary lines are adjusted and formed by lateral, predeterminable positioning steps of the sawing device.

6. A process as claimed in claim 1, wherein prior to the step of forming the sawed grooves on the first side of the wafer, an auxiliary layer for mechanically stabilizing the wafer is deposited on the second side thereof.

7. A process as claimed in claim 6, wherein the auxiliary layer is formed by increasing the thickness of the metal layer provided on the second side of wafer relative to the metal layer on the first side of the wafer.

8. A process as claimed in claim 6, wherein the auxiliary layer is formed by deposition of lacquer.

9. A process as claimed in claim 8, wherein the lacquer is a polyimide.

10. A process as claimed in claim 1, further comprising the steps of:

forming sawed grooves on the second side of the wafer; and silicon etching both the first and second sides of the wafer after the step of forming the sawed grooves on the second side of the wafer; and separating the wafer into the semiconductor devices along the sawed grooves.

11. A process for fabricating semiconductor devices from a semiconductor substrate of a first conductivity type having a first side and a second side, comprising the steps of:

diffusing an impurity into the first and second sides of the substrate to create first and second diffusion layers in the substrate of a second conductivity type opposite to the first conductivity type;

providing a metal layer on each of the first and second diffusion layers to form the substrate into a wafer;

forming sawed grooves on a first side of the wafer which correspond to the outline geometry of a semiconductor device;

providing a pincer-like device which uses the sawed grooves in the first side of the wafer to scribe lines in a second side of the wafer; and scribing lines, which are parallel to the sawed grooves, in the second side of the wafer by engaging and following the sawed grooves with the pincer-like device.

12. A process as claimed in claim 11, wherein the lines are scribed parallel to the sawed grooves of the first side of the wafer and are in a plane perpendicular to a plane defined by the wafer.

* * * * *